United States Patent
Fan et al.

(10) Patent No.: US 12,381,513 B2
(45) Date of Patent: Aug. 5, 2025

(54) IQ PHASE IMBALANCE CALIBRATION USING SAMPLING CLOCK DELAY ADJUSTMENT

(71) Applicant: GlobalFoundries U.S. Inc., Malta, NY (US)

(72) Inventors: Xiaozhe Fan, Colchester, VT (US); Mustapha Slamani, South Burlington, VT (US)

(73) Assignee: GlobalFoundries U.S. Inc., Malta, NY (US)

( * ) Notice: Subject to any disclaimer, the term of this patent is extended or adjusted under 35 U.S.C. 154(b) by 80 days.

(21) Appl. No.: 18/543,416

(22) Filed: Dec. 18, 2023

(65) Prior Publication Data

US 2025/0202428 A1 Jun. 19, 2025

(51) Int. Cl.
*H03D 3/02* (2006.01)
*H03D 3/00* (2006.01)

(52) U.S. Cl.
CPC .................................. *H03D 3/008* (2013.01)

(58) Field of Classification Search
CPC ..... H04L 27/3863; H04L 27/38; H03D 3/008; H03D 3/009
See application file for complete search history.

(56) References Cited

U.S. PATENT DOCUMENTS

| | | | |
|---|---|---|---|
| 6,208,701 B1 * | 3/2001 | Hiramatsu | H04L 7/0054 375/354 |
| 6,330,290 B1 | 12/2001 | Glas | |
| 6,636,085 B2 | 10/2003 | Okazaki et al. | |
| 8,260,229 B2 | 9/2012 | Motamed et al. | |
| 2009/0322578 A1 * | 12/2009 | Petrovic | H04L 27/38 324/76.78 |
| 2011/0189970 A1 | 8/2011 | Ohshiro | |
| 2012/0269245 A1 | 10/2012 | Mehrmanesh et al. | |

* cited by examiner

*Primary Examiner* — David S Huang
(74) *Attorney, Agent, or Firm* — Jessie Cheah; Hoffman Warnick LLC

(57) ABSTRACT

A system for phase imbalance calibration, including: an in-phase (I) signal channel including an analog-to-digital converter (ADC) for sampling an I signal to provide a sampled I signal; a quadrature (Q) signal channel including an ADC for sampling a Q signal to provide a sampled Q signal; a sampling clock for controlling the sampling of the ADC on the I signal channel and the sampling of the ADC on the Q signal channel; and sampling clock delay circuitry for adjusting one of a sampling start time of the ADC on the I channel and a sampling start time of the ADC on the Q channel relative to one another such that the sampled I signal and the sampled Q signal are in phase.

19 Claims, 8 Drawing Sheets

IQ PHASE IMBALANCE CALIBRATION USING SAMPLING CLOCK DELAY ADJUSTMENT

BACKGROUND

The present invention relates generally to wireless communication systems and, more particularly, to a system and method for IQ phase imbalance calibration using sampling clock delay adjustment.

A wireless communication device may include one or more transmitters and receivers to support bi-directional communication. A transmitter may condition and upconvert in-phase (I) and quadrature (Q) output baseband signals to obtain an output radio frequency (RF) signal for transmission via a wireless channel. A receiver may receive an RF signal via the wireless channel and may downconvert the RF signal to obtain the in-phase I and Q signals.

The transmitter and receiver each may include separate signal channels for the I and Q signals. Ideally, the I and Q signals have equal gain with a 90 degree phase difference from each other. However, imbalances may exist between the I signal channel and the Q signal channel, which may degrade the performance of the transmitter and the receiver. A conventional technique to calibrate an IQ phase imbalance between the I signal channel and the Q signal channel includes applying a delay to either the I signal channel or the Q signal channel using, for example, asymmetric filters, a variable phase shifter, a delay line, etc. This delay is applied to the I signal channel or the Q signal channel prior to the sampling of the I and Q signals. Another technique uses a digital signal processor to estimate phase imbalance coefficients using sampled I and Q signals. In this technique, the digital signal processor uses the estimated phase imbalance coefficients to digitally compensate for the phase imbalance.

SUMMARY

Aspects of the disclosure include a system for phase imbalance calibration, including: an in-phase (I) signal channel including an analog-to-digital converter (ADC) for sampling an I signal to provide a sampled I signal; a quadrature (Q) signal channel including an ADC for sampling a Q signal to provide a sampled Q signal; a sampling clock for controlling the sampling of the ADC on the I signal channel and the sampling of the ADC on the Q signal channel; and sampling clock delay circuitry for adjusting one of a sampling start time of the ADC on the I channel and the ADC on the Q channel relative to one another such that the sampled I signal and the sampled Q signal are in phase.

Aspects of the disclosure further include a method for phase imbalance calibration of a system, including: synchronizing a sampling of an in-phase (I) signal on an I signal channel of the system and a sampling of a quadrature (Q) signal on a Q signal channel of the system; adjusting a phase of a sampling clock to apply a sampling delay to one of the I signal and the Q signal; sampling the I and Q signals to provide I and Q samples; performing a complex fast Fourier transform (FFT) on the I and Q samples; determining an image rejection for the measurement system based on the FFT; and comparing the image rejection for the system to a target value for the image rejection.

Additional aspects of the disclosure include a phase imbalance calibrated system for measuring a phase imbalance of a device, including: an in-phase (I) signal channel including an analog-to-digital converter (ADC) for sampling an I signal from the device to provide a sampled I signal; a quadrature (Q) signal channel including an ADC for sampling a Q signal from the device to provide a sampled Q signal; a sampling clock for controlling a sampling of the ADC on the I signal channel and a sampling of the ADC on the Q signal channel; and sampling clock delay circuitry for adjusting one of a sampling start time of the ADC on the I channel and a sampling start time of the ADC on the Q channel relative to one another based on a sampling delay stored in a memory.

BRIEF DESCRIPTION OF THE DRAWINGS

The present invention will be better understood from the following detailed description with reference to the drawings, which are not necessarily drawn to scale. In the drawings, like reference numerals refer to like features in the various views.

DETAILED DESCRIPTION

Figure 1:
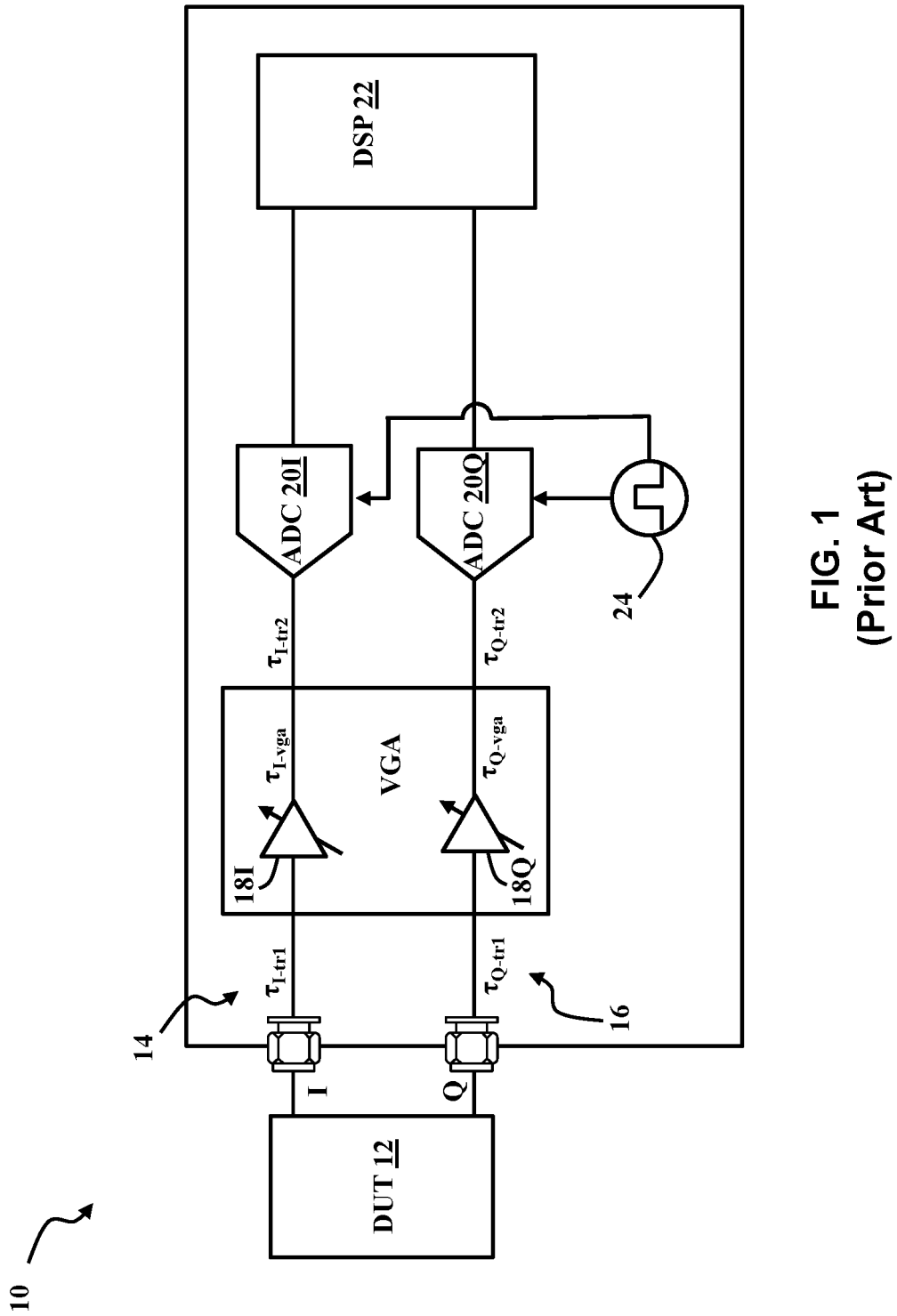
FIG. 1 depicts a prior art IQ phase measurement system for measuring the phase imbalance of the in-phase (I) and quadrature (Q) signals of a device under test (DUT).

The disclosure will now be described with reference to systems and methods for IQ phase imbalance calibration using sampling clock delay adjustment. While the disclosure will be described hereinafter in connection with specific devices and methods thereof, it will be understood that limiting the disclosure to such specific devices and methods is not intended. On the contrary, it is intended to cover all alternatives, modifications, and equivalents as may be included within the spirit and scope of the disclosure as defined by the appended claims.

For a general understanding of the features of the disclosure, reference is made to the drawings. The drawings are not to scale; however, in the drawings, like reference numerals have been used throughout to identify identical elements.

It will be readily understood that the devices and methods of the present disclosure, as generally described and illustrated in the drawings herein, may be arranged and designed in a wide variety of different configurations in addition to the devices and methods described herein. Thus, the following detailed description of the devices and methods, as represented in the drawings, is not intended to limit the scope defined by the appended claims but is merely representative of selected devices and methods. The following description is intended only by way of example, and simply illustrates certain concepts of the devices and methods, as disclosed and claimed herein.

FIG. 1 depicts an example of a prior art IQ phase measurement system 10 for measuring the phase imbalance of the in-phase (I) and quadrature (Q) signals of a device under test (DUT) 12 (e.g., a transceiver). As shown, the IQ phase measurement system 10 may include an I signal channel 14 and a Q signal channel 16. The IQ phase measurement system 10 may further include variable-gain-control amplifiers (VGAs) 18I, 18Q for amplifying the I and Q signals received from the DUT 12, analog-to-digital converters (ADCs) 20I, 20Q for sampling the amplified I and Q signals, a digital signal processor (DSP) 22 for processing the sampled I and Q signals, and a sampling clock 24 for controlling the sampling frequency of the ADCs 20I, 20Q.

As shown in FIG. 1, in the I signal channel 14, the connection (e.g., printed circuit board (PCB) trace) from the I signal input of the IQ phase measurement system 10 to the VGA 18I may introduce a first delay $\tau_{I\text{-}tr1}$, the VGA 18I may introduce another delay $\tau_{I\text{-}vga}$, and the connection between the VGA 18I and the ADC 20I may introduce a further delay $\tau_{I\text{-}tr2}$. To this extent, the total delay of the I signal introduced by the I signal channel 14 of the IQ phase measurement system 10 may be given by $\tau_I = \tau_{I\text{-}tr1} + \tau_{I\text{-}vga} + \tau_{I\text{-}tr2}$. Similarly, the total delay of the Q signal introduced by the Q signal channel 16 of the IQ phase measurement system 10 may be given by $\tau_Q = \tau_{Q\text{-}tr1} + \tau_{Q\text{-}vga} + \tau_{Q\text{-}tr2}$. Generally, $\tau_I \neq \tau_Q$, due, for example, to PCB trace length and parasitic mismatch in the IQ phase measurement system 10 (e.g., $\tau_{I\text{-}tr1} \neq \tau_{Q\text{-}tr1}$, $\tau_{I\text{-}tr2} \neq \tau_{Q\text{-}tr2}$) and VGA parasitic and propagation delay mismatch in the IQ phase measurement system 10 (e.g., $\tau_{I\text{-}vga} \neq \tau_{Q\text{-}vga}$).

Figure 2:
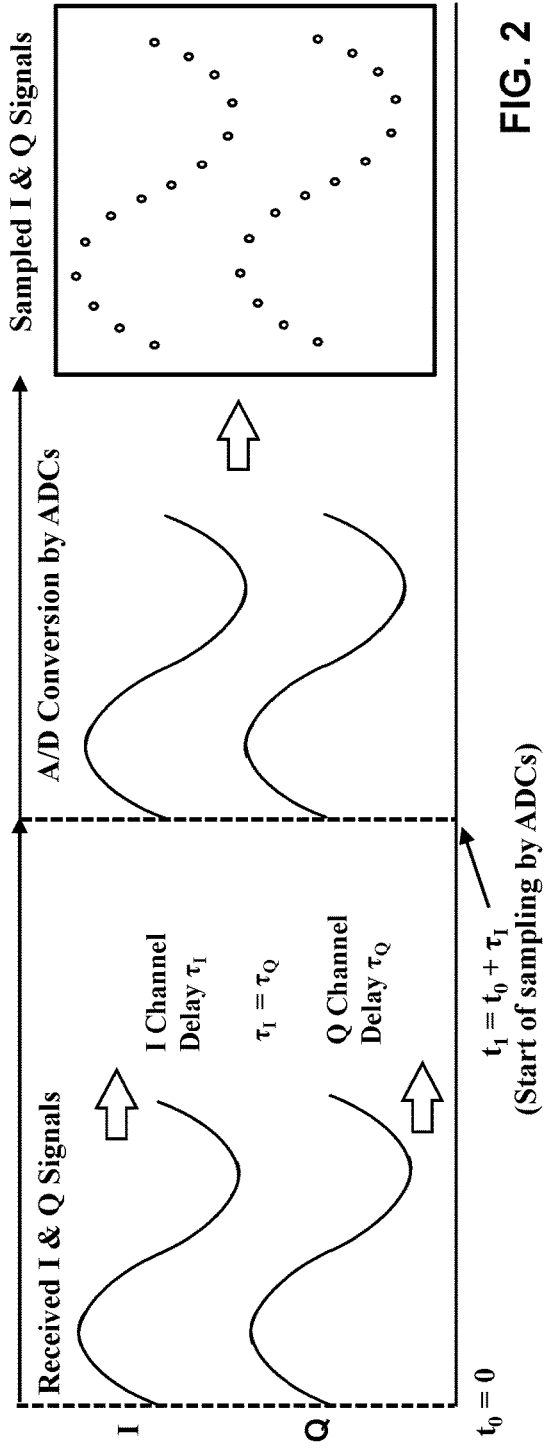
FIG. 2 depicts an example of the output of the IQ phase measurement system of FIG. 1 when the delay ii of the I signal introduced by the I signal channel and the delay $\tau_Q$ of the Q signal introduced by the Q signal channel are equal.
Figure 4:
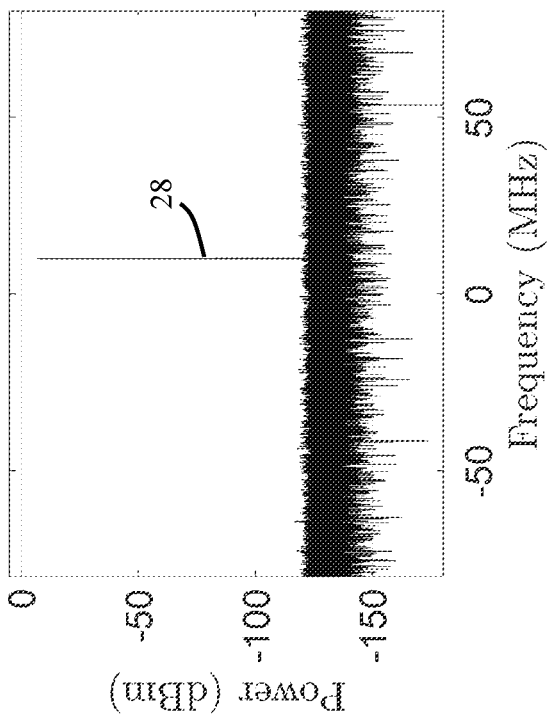
FIG. 4 depicts illustrative measured signal tones in the frequency domain using the IQ phase measurement system of FIG. 1 with balanced I and Q channels.

FIG. 2 depicts an example of the output of the IQ phase measurement system 10 of FIG. 1 when the delay Ti of the I signal introduced by the I signal channel 14 of the IQ phase measurement system 10 and the delay $\tau_Q$ of the Q signal introduced by the Q signal channel 16 of the IQ phase measurement system 10 are equal (e.g., $\tau_I = \tau_Q$). In the example of FIG. 2, I and Q signals are generated in phase for sake of discussion. The ADCs 20I, 20Q start the sampling of the I and Q signals at the same time, $t_1 = t_0 + \tau_I$ (or $t_1 = t_0 + \tau_Q$, since $\tau_I = \tau_Q$), and output identical sampled I and Q signals that are also in phase. As such, the I and Q signal channels 14, 16 of the IQ phase measurement system 10 do not introduce any phase imbalance to the I and Q signals. An illustrative main tone 28 measured in the frequency domain spectrum using the IQ phase measurement system 10 when $\tau_I = \tau_Q$ is depicted in FIG. 4.

Figure 3:
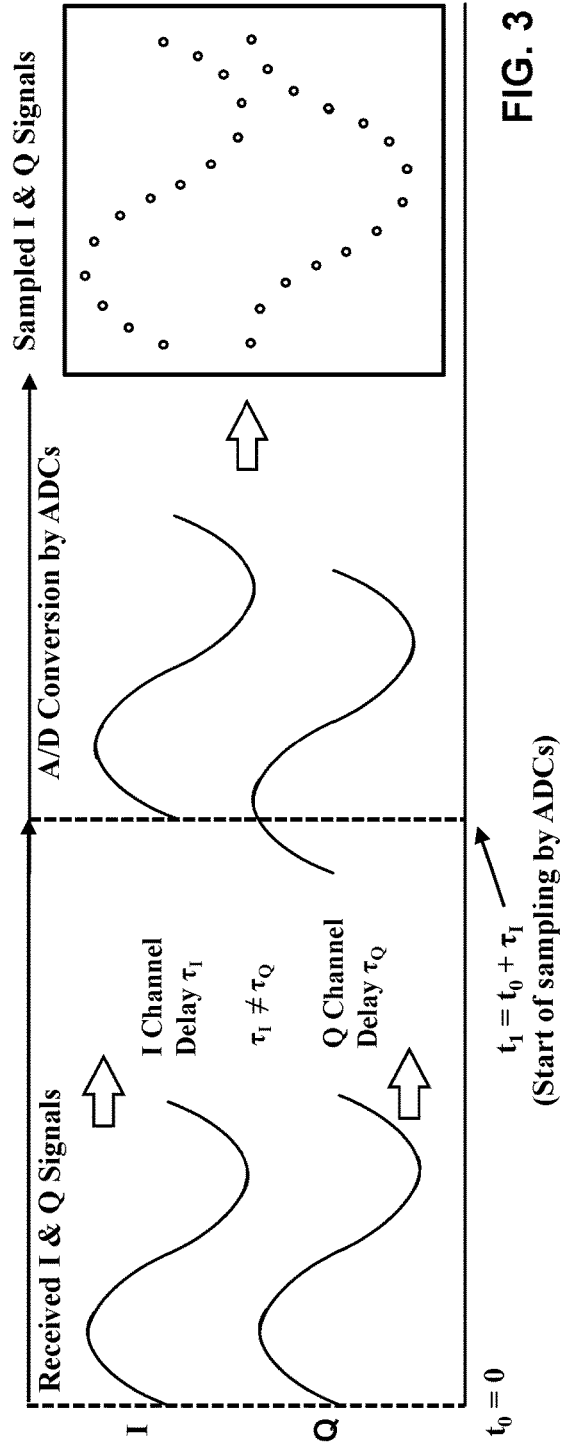
FIG. 3 depicts an example of the output of the IQ phase measurement system of FIG. 1 when the delay $\tau_I$ of the I signal introduced by the I signal channel and the delay $\tau_Q$ of the Q signal introduced by the Q signal channel are not equal.
Figure 5:
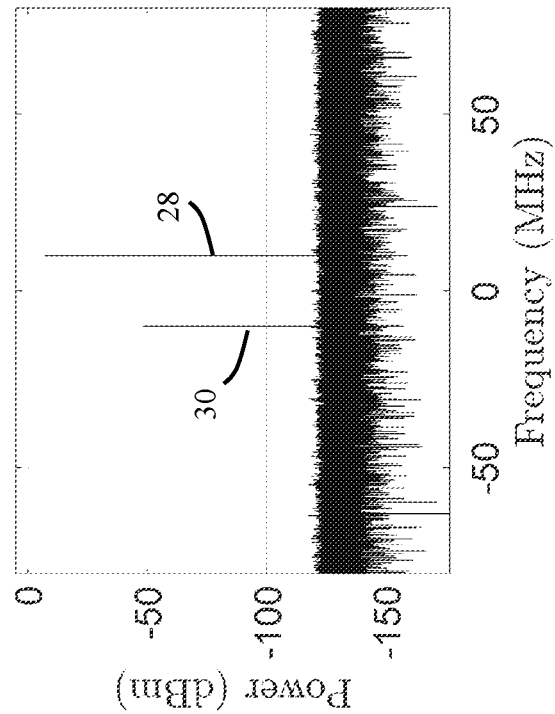
FIG. 5 depicts illustrative measured signal tones in the frequency domain using the IQ phase measurement system of FIG. 1 with imbalanced I and Q channels.

FIG. 3 depicts the output of the ADCs 20I, 20Q when the I and Q signals received at inputs of the IQ phase measurement system 10 are in phase and there is a phase imbalance introduced by the I and Q channels 14, 16 of the IQ phase measurement system 10 (e.g., $\tau_I \neq \tau_Q$). In FIG. 3, the ADCs 20 I, 20 Q start the sampling of the I and Q signals at the same time, $t_1 = t_0 + \tau_I$. As a result, the sampled I and Q signals output by the ADCs 20I, 20Q are out of phase. An illustrative main tone 28 in the frequency domain spectrum measured using the IQ phase measurement system 10 with imbalanced I and Q signals is depicted in FIG. 5. Comparing FIGS. 4 and 5, in the case of imbalanced I and Q signals, an undesired signal tone (referred to as an image tone 30) appears on the opposite side of DC from the main tone 28. The image tone 30 is a result of the I and Q phase imbalance introduced by the IQ phase measurement system 10. The amount of image rejection provided by the IQ phase measurement system 10 is defined as the difference in amplitude of the main tone 28 and the image tone 30. The image rejection ratio of the IQ phase measurement system 10 is defined as the ratio of the amplitude of the main tone 28 and the amplitude of the image 30.

Figure 6:
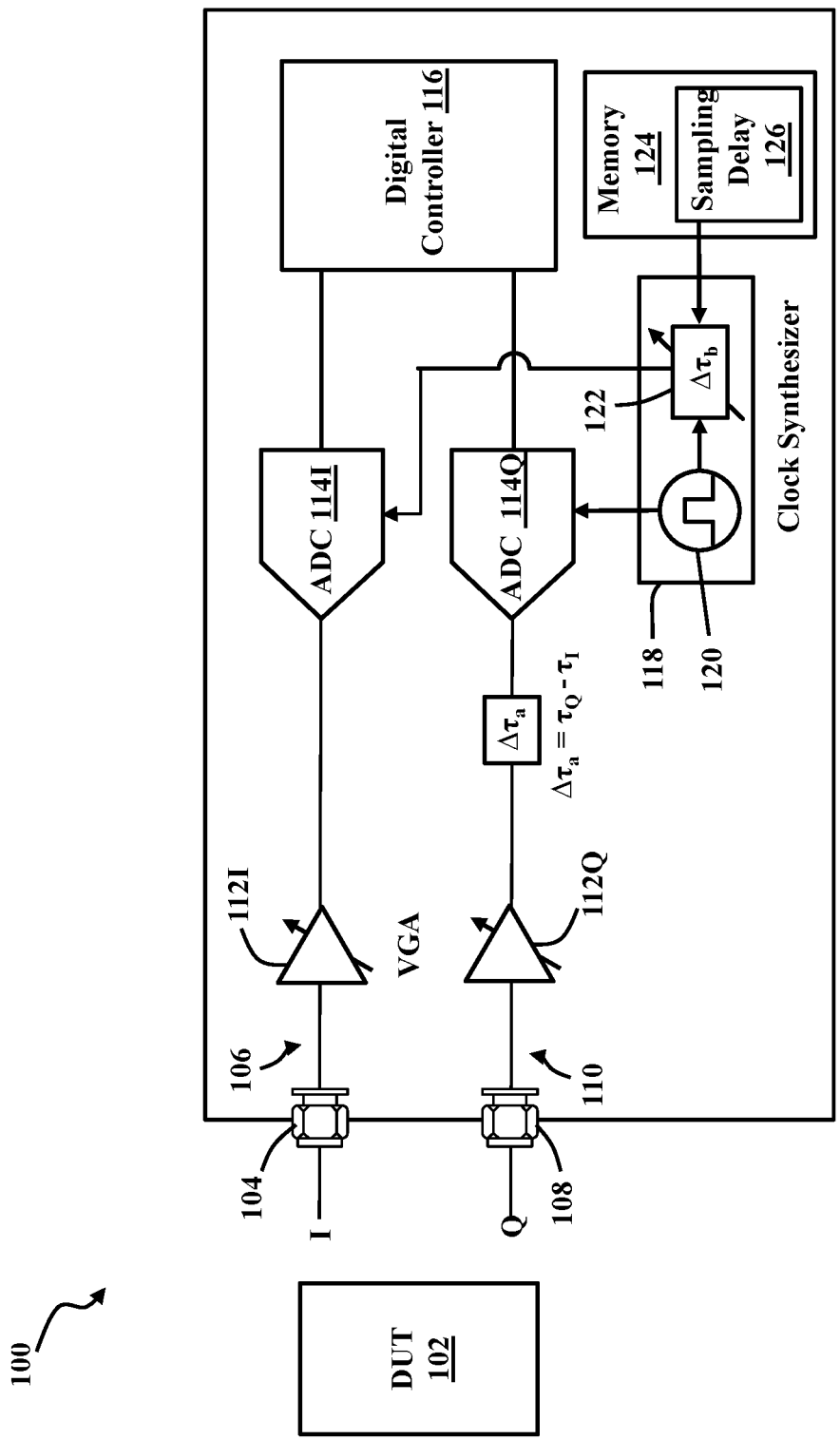
FIG. 6 depicts a system for IQ phase imbalance calibration using sampling clock delay adjustment according to embodiments of the disclosure.

FIG. 6 depicts a system 100 for IQ phase imbalance calibration using sampling clock delay adjustment according to embodiments of the disclosure. Once calibrated, the system 100 measures the IQ phase imbalance of the DUT 102, without introducing any (or minimal) phase imbalance itself to the I and Q signals received from the DUT 102.

The system 100 includes an I signal input 104, an I signal channel 106, a Q signal input 108, and a Q signal channel 110. As shown, the I signal channel 106 includes a VGA 112I for amplifying an inputted I signal and an ADC 114I for sampling the amplified I signal. Similarly, the Q signal channel 110 includes a VGA 112Q for amplifying an inputted Q signal and an ADC 114Q for sampling the amplified Q signal. A digital controller 116 receives and processes the sampled I and Q digital signals from the ADCs 114I, 114Q.

Figure 8:
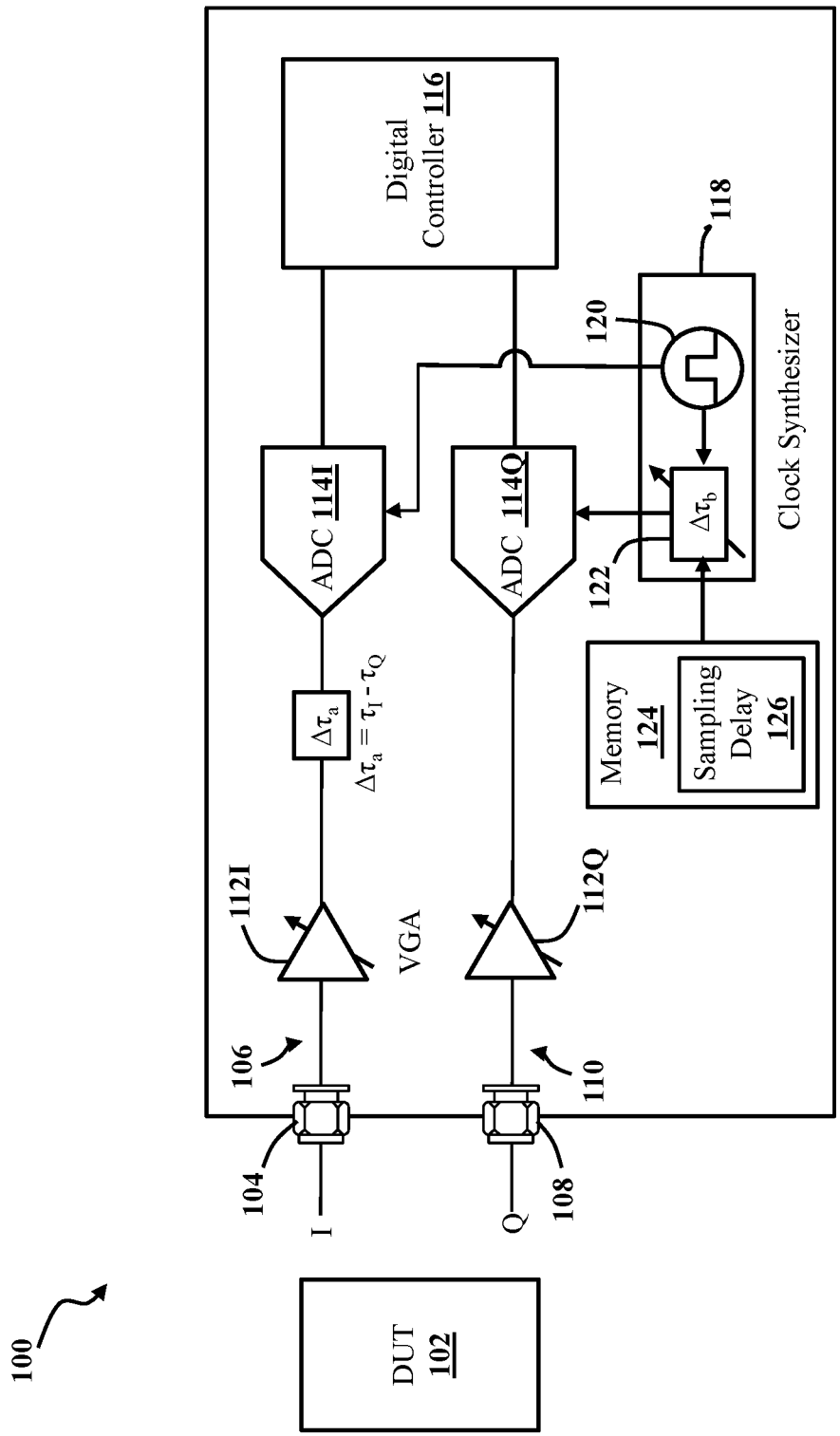
FIG. 8 depicts a system for IQ phase imbalance calibration using sampling clock delay adjustment according to additional embodiments of the disclosure.

According to embodiments of the disclosure, the system 100 further includes a clock synthesizer 118. The clock synthesizer 118 includes a sampling clock 120 for controlling the sampling of the ADCs 114I, 114Q. The clock synthesizer 118 further includes sampling clock delay circuitry 122 for adjusting the sampling start time of one of the ADCs 114I, 114Q relative to the other such that the sampled I and Q signals output by the ADCs 114I, 114Q are in phase. In the embodiment depicted in FIG. 6, the sampling clock delay circuitry 122 is configured to adjust the sampling start time of the ADC 114I relative to the sampling start time of the ADC 114Q (e.g., adjusting the phase of the sampling clock 120 applied to the ADC 114I). However, as depicted in FIG. 8, the sampling clock delay circuitry 122 may also be configured to adjust the sampling start time of the ADC 114Q relative to the sampling start time of the ADC 114I.

Figure 7:
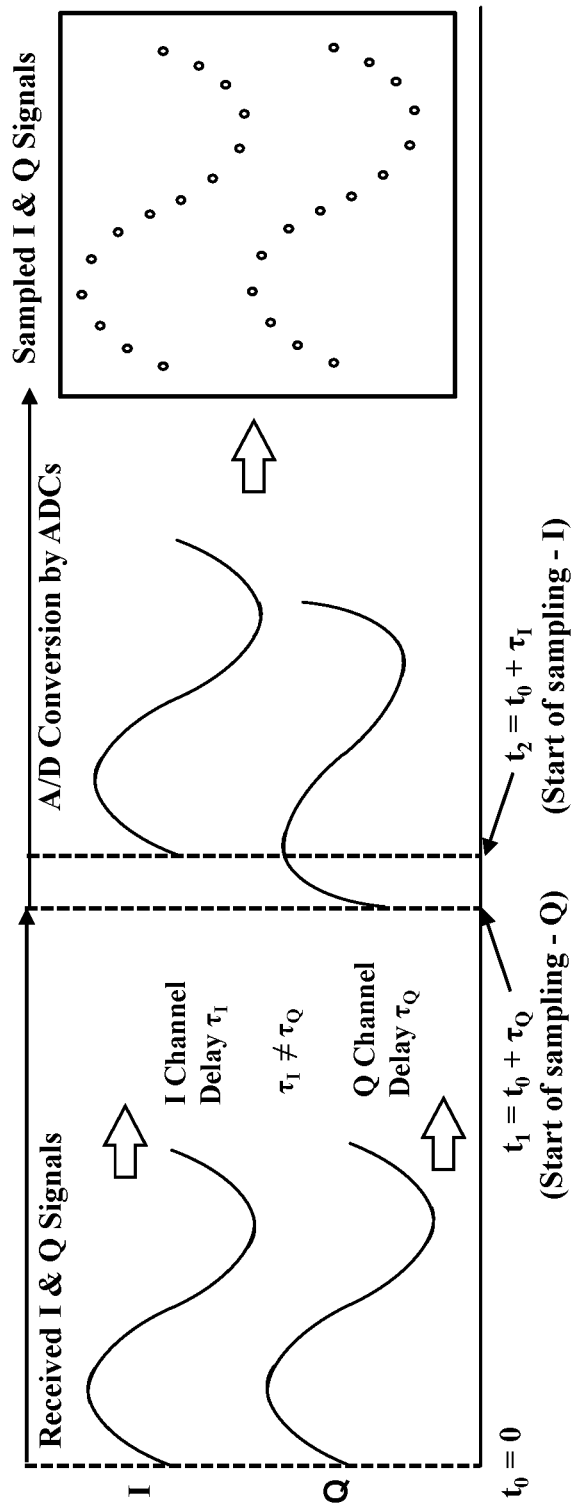
FIG. 7 depicts an example of the output of the IQ phase measurement system of FIG. 6 when the delay $\tau_I$ of the I signal introduced by the I signal channel and the delay $\tau_Q$ of the Q signal introduced by the Q signal channel are not equal according to embodiments of the disclosure.

FIG. 7 depicts the output of the ADCs 114I, 114Q of FIG. 6 when the I and Q signals received at inputs of the IQ phase measurement system 100 are in phase and there is a phase imbalance introduced by the I and Q channels 106, 110 of the IQ phase measurement system 100 (e.g., $\tau_I \neq \tau_Q$). In FIG. 7, the phase imbalance introduced by the I and Q channels 106, 110 of the IQ phase management system 100 results in the I signal being delayed relative to the Q signal. To this extent, according to embodiments of the disclosure, the ADC 114Q starts the sampling of the Q signal at a time $t_1 = t_0 + \tau_Q$, while the ADC 114I begins sampling the I signal at a later time $t_1 = t_0 + \tau_I$. As a result, the sampled I and Q signals output by the ADCs 114I, 114Q are brought back in phase, thereby compensating for any phase imbalance introduced by the I and Q channels 106, 110 of the IQ phase management system 100.

Figure 9:
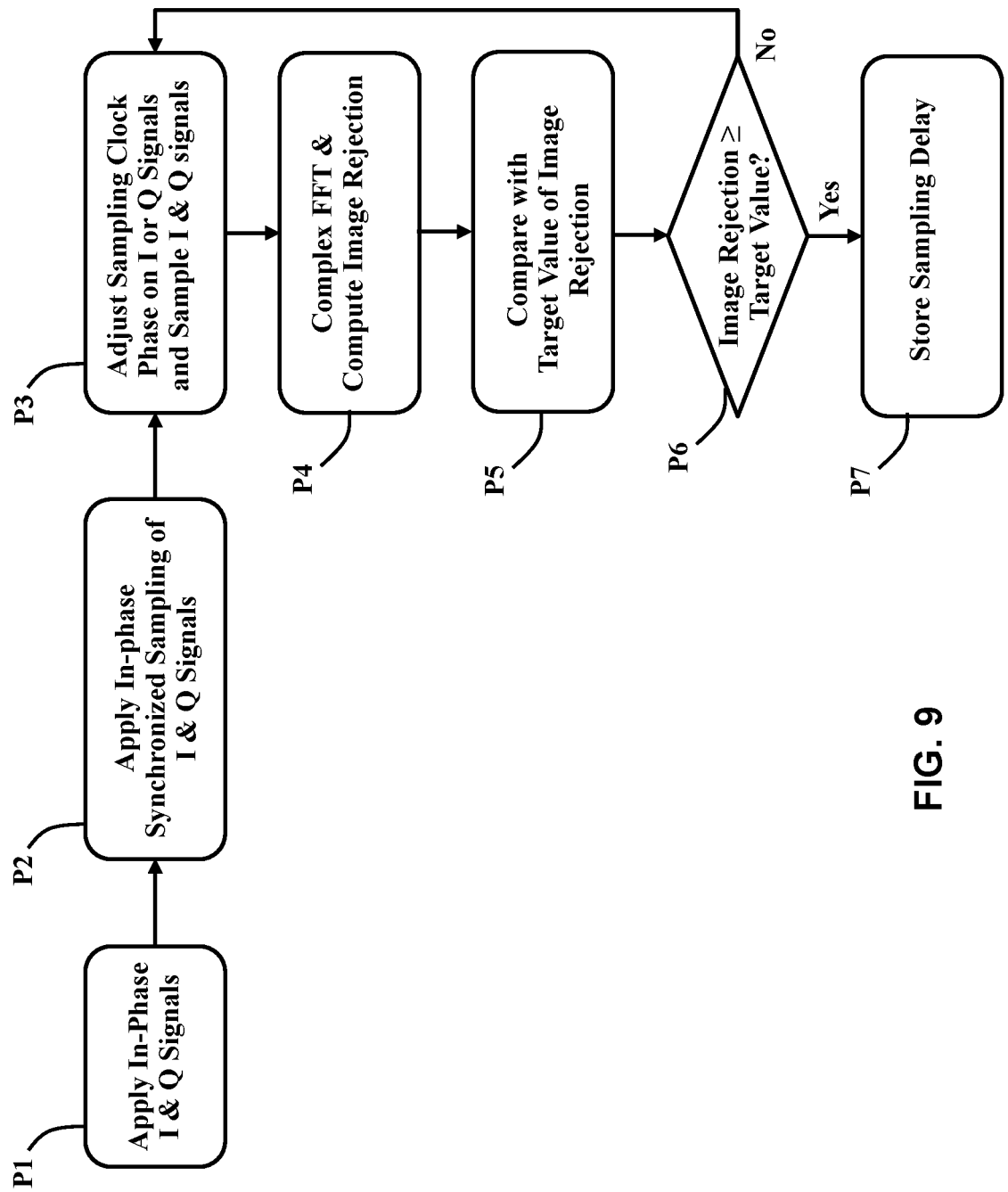
FIG. 9 depicts a flow diagram of a process for calibrating the system of FIG. 6 or FIG. 7 according to embodiments of the disclosure.

FIG. 9 depicts a flow diagram of a process for calibrating the system 100 according to embodiments of the disclosure.

At process P1, calibrated in-phase (e.g., National Institute of Standards and Technology (NIST)) I and Q signals are applied to the I and Q signal inputs 104, 108 of the system 100. At process P2, the sampling clock 120 controls the sampling of the ADCs 114I, 114Q to provide in-phase synchronized sampling of the received I and Q signals.

At process P3, the phase of the sampling clock 120 applied to one of the ADCs 114I, 114Q is adjusted to apply a sampling delay to the I or Q signal, respectively, and the I and Q signals are again sampled. The sampling delay may be provided, for example, in increments of ±0.10 or less, thereby providing linear control of the sampling delay. The sampling delay may be a positive or negative delay. At process P4, the sampled I and Q signals undergo a complex fast Fourier transform (FFT) process and the image rejection of the system 100 is computed based on the FFT. The FFT and/or computation of the image rejection may be performed, for example, by the digital controller 116 and/or by a digital signal processor or computer system external to the system 100. At process P5, the image rejection of the system 100 for the sampling delay applied to the I or Q signal at process P3 is compared to a target value for the image rejection. At process P6, if the image rejection computed in process P4 is greater than or equal to the target value for the image rejection (Yes at process P6), the sampling delay applied to the I or Q signal at process P3 is stored in memory (e.g., sampling delay 126 stored in memory 124 in system 100) at process P7. If the image rejection is less than the target value for the image rejection (No at process P6), then flow passes back to process P3, where the sampling delay is again adjusted. Processes P3-P6 are repeated as necessary until the image rejection computed in process P4 is greater than or equal to the target value for the image rejection (YES at process P6).

In the system 100 depicted in FIG. 6, the difference between the delay $\tau_I$ introduced by the I signal channel 106 and the delay $\tau_Q$ introduced by the Q signal channel 110 is given by $\Delta\tau_a = \tau_Q - \tau_I$. According to embodiments, the sampling clock delay circuitry 122 of the clock synthesizer 118 is configured to determine a sampling clock delay $\Delta\tau_b$ and to adjust the sampling start time (e.g., phase) of the sampling clock 120 applied to the ADC 114I in the I signal channel 106 by the sampling clock delay $\Delta\tau_b$ to compensate for $\Delta\tau_a$. In an ideal system, $\Delta\tau_b - \Delta\tau_a = 0$. In general, however, $\Delta\tau_b - \Delta t_a \approx 0$. Once calibrated in this manner, the system 100 may be used to measure the IQ phase imbalance of a DUT 102, without introducing any (or at least minimal) phase imbalance itself to the I and Q signals received from the DUT 102. The system 100 shown in FIG. 8 may be calibrated in a similar manner by adjusting the sampling start time of the sampling clock 120 applied to the ADC 114Q in the Q signal channel 110 by the sampling clock delay $\Delta\tau_b$ to compensate for $\Delta\tau_a$.

Figure 11:
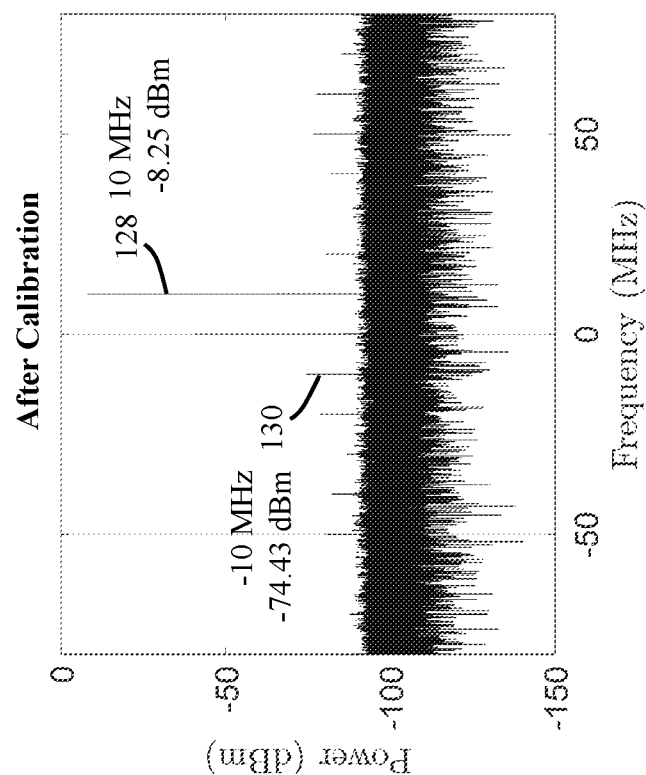
FIG. 11 depicts the output of the system of FIG. 6 after calibration.
Figure 10:
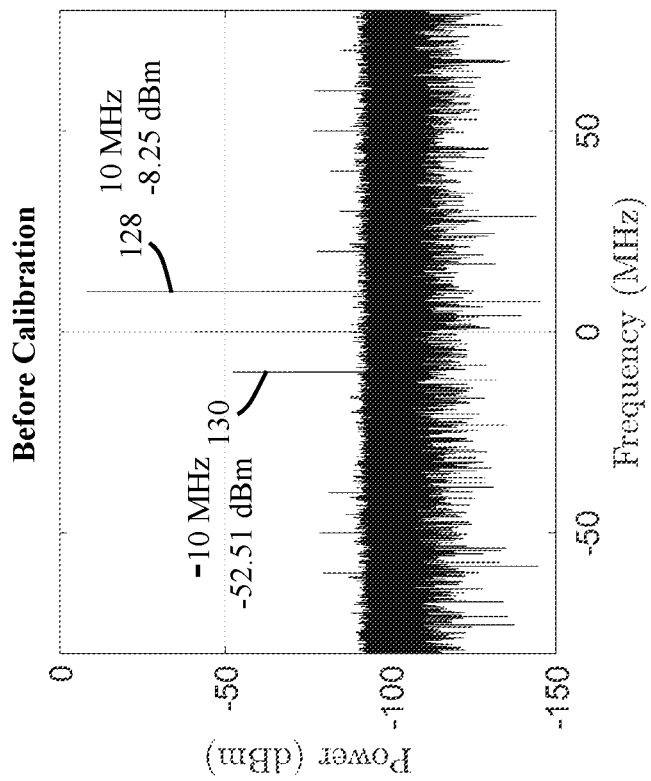
FIG. 10 depicts the output of the system of FIG. 6 before calibration.

An example of the output of the system 100 before and after calibration is depicted in FIGS. 10 and 11, respectively. In FIGS. 10 and 11, a main tone 128 of 10 MHz of the system 100 has a power of −8.25 dBm. Before calibration of the system 100, as shown in FIG. 10, an image tone 130 of −10 MHz with a power of −52.51 dBm is generated. To this extent, the image rejection prior to calibration of the system 100 is 44.26 dBm. After calibration of the system 100 as disclosed herein, as shown in FIG. 11, an image tone 130 of −10 MHz with a power of −74.43 dBm is generated, with the image rejection of the system 100 equal to 66.18 dBm. Comparing the image 130 in FIGS. 10 and 11, it can be seen in FIG. 11 that the image rejection of the system 100 improved approximately 22 dBm after being calibrated as disclosed herein.

A mathematical model for IQ phase imbalance by adjusting the phase of the sampling clock 120 in the system 100 is now described. Assuming balanced I and Q signals, then $I(t)=\cos(2\pi f_i t)$ and $Q(t)=\sin(2\pi f_i t)$. With a phase imbalance of $\Delta\varphi_a$, the inputs to the ADC's 114I, 114Q become $I_\tau(t) = \cos(2\pi f_i t)$ and $Q_\tau(t)=\sin(2\pi f_i t+\Delta\varphi_a)$, where $f_i$ is the frequency of the I and Q signals, and $\Delta\varphi_a$ is the phase imbalance. To compensate for the phase imbalance $\Delta\varphi_a$, the sampling clock 120 at the ADC 114I is delayed by $\Delta t_b = \Delta\varphi_b / 2\pi f_i$. Compensation occurs when $2\pi f_i \Delta t_b = \Delta\varphi_a$.

It should be understood that the terminology used herein is for the purpose of describing the disclosed structures and methods and is not intended to be limiting. For example, as used herein, the singular forms "a," "an," and "the" are intended to include the plural forms as well, unless the context clearly indicates otherwise. Additionally, as used herein, the terms "comprises," "comprising," "includes," and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right," "left," "vertical," "horizontal," "top," "bottom," "upper," "lower," "under," "below," "underlying," "over," "overlying," "parallel," "perpendicular," etc., are intended to describe relative locations as they are oriented and illustrated in the drawings (unless otherwise indicated) and terms such as "touching," "in direct contact," "abutting," "directly adjacent to," "immediately adjacent to," etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

References herein to terms modified by language of approximation, such as "about," "approximately," and "substantially," are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical," "horizontal," etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or "in direct contact with" another feature if intervening features are absent. A feature may be "indirectly on" or "in indirect contact with" another feature if at least one intervening feature is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The invention claimed is:

1. A system for phase imbalance calibration, comprising:
an in-phase (I) signal channel including an analog-to-digital converter (ADC) for sampling an I signal to provide a sampled I signal;
a quadrature (Q) signal channel including an ADC for sampling a Q signal to provide a sampled Q signal;
a sampling clock for controlling the sampling of the ADC on the I signal channel and the sampling of the ADC on the Q signal channel; and
sampling clock delay circuitry for adjusting one of a sampling start time of the ADC on the I channel and a sampling start time of the ADC on the Q channel relative to one another such that the sampled I signal and the sampled Q signal are in phase.

2. The system according to claim 1, further comprising a memory, wherein the sampling clock delay circuitry is configured to adjust the sampling start time based on a sampling delay for the system stored in the memory.

3. The system according to claim 2, wherein the sampling delay is based on a difference between a delay introduced to the I signal by the I signal channel and a delay introduced to the Q signal by the Q signal channel.

4. The system according to claim 1, further comprising:
a variable-gain-control amplifier (VGA) coupled to an input of the ADC on the I signal channel for amplifying the I signal;
a variable-gain-control amplifier coupled to an input of the ADC on the Q signal channel for amplifying the Q signal; and
a digital controller for receiving the sampled I and Q signals from the ADC on the I signal channel and the ADC on the Q signal channel.

5. A method for phase imbalance calibration of a system, comprising:
synchronizing a sampling of an in-phase (I) signal on an I signal channel of the system and a sampling of a quadrature (Q) signal on a Q signal channel of the system;
adjusting a phase of a sampling clock to apply a sampling delay to one of the I signal and the Q signal;
sampling the I and Q signals to provide I and Q samples;
performing a fast Fourier transform (FFT) on the I and Q samples;
determining an image rejection for the system based on the FFT; and
comparing the image rejection for the system to a target value for the image rejection.

6. The method according to claim 5, wherein, prior to the synchronizing, inputting in-phase calibrated I and Q signals to the system.

7. The method according to claim 5, wherein, if the image rejection for the system is greater than or equal to the target value for the image rejection, storing the sampling delay in a memory of the system.

8. The method according to claim 7, wherein the I signal channel includes an analog-to-digital converter (ADC) for sampling the I signal to provide a sampled I signal, wherein the Q channel includes an ADC for sampling the Q signal to provide a sampled Q signal, and wherein the method further includes adjusting a sampling start time of the ADC on the I channel or a sampling start time of the ADC on the Q channel relative to one another.

9. The method according to claim 8, wherein the sampling start time of the ADC on the I channel or the sampling start time of the ADC on the Q channel are adjusted relative to one another based on the sampling delay stored in the memory.

10. The method according to claim 9, wherein the sampling start time of the ADC on the I channel or the sampling start time of the ADC on the Q channel are adjusted relative to one another such that the sampled I signal and the sampled Q signal are in phase.

11. The method according to claim 10, further comprising, after adjusting the sampling start time:
receiving I and Q signals from a device; and
measuring a phase imbalance of the device.

12. The method according to claim 11, wherein the device comprises a transceiver.

13. The method according to claim 5, wherein, if the image rejection for the system is less than the target value for the image rejection, repeating the following steps until the image rejection for the system is greater than or equal to the target value for the image rejection:
adjusting the phase of the sampling clock to apply a different sampling delay to the I or Q signal;
sampling the I and Q signals to provide I and Q samples;
performing a fast Fourier transform (FFT) on the I and Q samples;
determining the image rejection for the system based on the FFT; and
comparing the image rejection for the system to the target value for the image rejection.

14. The method according to claim 5, wherein the phase of the sampling clock is adjusted in increments of ±0.10 or less.

15. A phase imbalance calibrated system for measuring a phase imbalance of a device, comprising:
an in-phase (I) signal channel including an analog-to-digital converter (ADC) for sampling an I signal from the device to provide a sampled I signal;
a quadrature (Q) signal channel including an ADC for sampling a Q signal from the device to provide a sampled Q signal;

a sampling clock for controlling a sampling of the ADC on the I signal channel and a sampling of the ADC on the Q signal channel; and sampling clock delay circuitry for adjusting one of a sampling start time of the ADC on the I channel and a sampling start time of the ADC on the Q channel relative to one another based on a sampling delay stored in a memory.

16. The method according to claim 15, wherein the phase imbalance calibrated system does not introduce any phase imbalance to the sampled I and Q signals of the device.

17. The system according to claim 15, wherein the sampling delay is based on a difference between a delay introduced to the I signal by the I signal channel and a delay introduced to the Q signal by the Q signal channel.

18. The system according to claim 15, further comprising:
a variable-gain-control amplifier (VGA) coupled to an input of the ADC on the I signal channel for amplifying the I signal;
a variable-gain-control amplifier coupled to an input of the ADC on the Q signal channel for amplifying the Q signal; and
a digital controller for receiving the sampled I and Q signals from the ADC on the I signal channel and the ADC on the Q signal channel.

19. The system according to claim 15, wherein the device comprises a transceiver.

* * * * *

UNITED STATES PATENT AND TRADEMARK OFFICE
CERTIFICATE OF CORRECTION

| | |
|---|---|
| PATENT NO. | : 12,381,513 B2 |
| APPLICATION NO. | : 18/543416 |
| DATED | : August 5, 2025 |
| INVENTOR(S) | : Xiaozhe Fan and Mustapha Slamani |

Page 1 of 1

It is certified that error appears in the above-identified patent and that said Letters Patent is hereby corrected as shown below:

In the Claims

In Column 8, Claim 14, Line 58, delete "… of ± 0.10 or…" and insert --"…of ± 0.1° or…"--, therefor.

Signed and Sealed this
Sixteenth Day of September, 2025

Coke Morgan Stewart
*Acting Director of the United States Patent and Trademark Office*